United States Patent [19]

Clark et al.

[11] Patent Number: 5,703,587

[45] Date of Patent: Dec. 30, 1997

[54] DIGITAL-TO-ANALOG CONVERTER HAVING OVERLAPPING SEGMENTS

[75] Inventors: Iain R. Clark, San Jose, Calif.; Alan Fiedler, Minneapolis, Minn.

[73] Assignee: LSI Logic Corporation, Milpitas, Calif.

[21] Appl. No.: 635,338

[22] Filed: Apr. 19, 1996

[51] Int. Cl.$^6$ ................................................. H03M 1/66
[52] U.S. Cl. ........................ 341/144; 341/145; 341/118
[58] Field of Search ................................ 341/144, 153, 341/145, 118, 120

[56] References Cited

U.S. PATENT DOCUMENTS

| | | | |
|---|---|---|---|
| 4,410,879 | 10/1983 | Gumm et al. | 340/347 |
| 4,868,571 | 9/1989 | Inamasu | 341/118 |
| 4,963,870 | 10/1990 | Obinata | 341/118 |
| 4,998,108 | 3/1991 | Ginthner et al. | 341/145 |

*Primary Examiner*—Jeffrey A. Gaffin
*Assistant Examiner*—Peguy JeanPierre
*Attorney, Agent, or Firm*—Westman, Champlin & Kelly, P.A.

[57] ABSTRACT

A digital-to-analog converter (DAC) for converting a multi-bit digital word into a corresponding analog value. The converter divides the digital word into a least significant word portion $n_1$ and a most significant word portion $n_2$. The portions overlap in that the weight of the most significant bit (msb) of word portion $n_1$ is the same as the weight of the least significant bit (lsb) of word portion $n_2$. The converter detects when the lsb of word portion $n_2$ changes state, and responsively inverts the state of the msb of word portion $n_1$. Word portions $n_1$ and $n_2$ are then translated into respective analog values which are summed together.

16 Claims, 13 Drawing Sheets

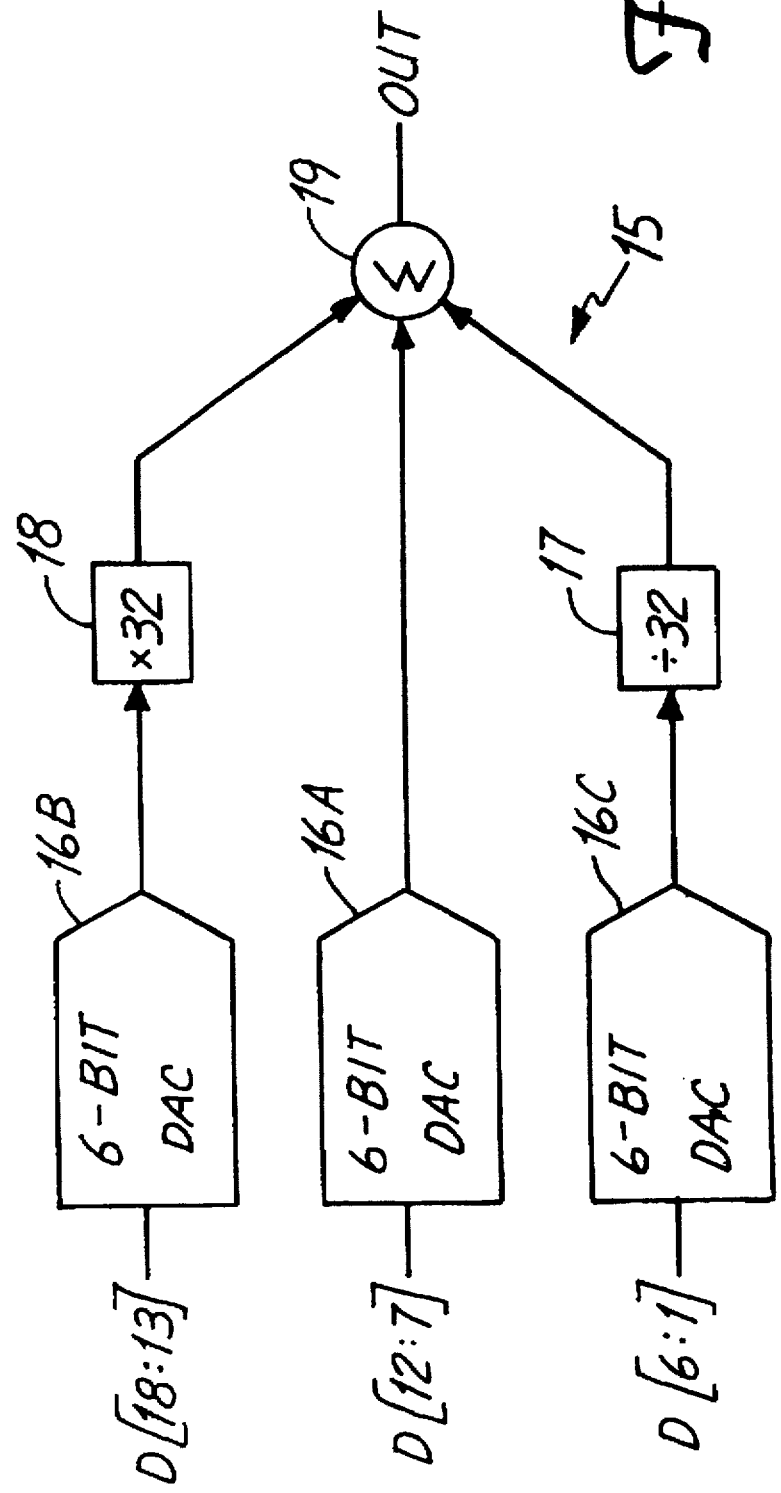

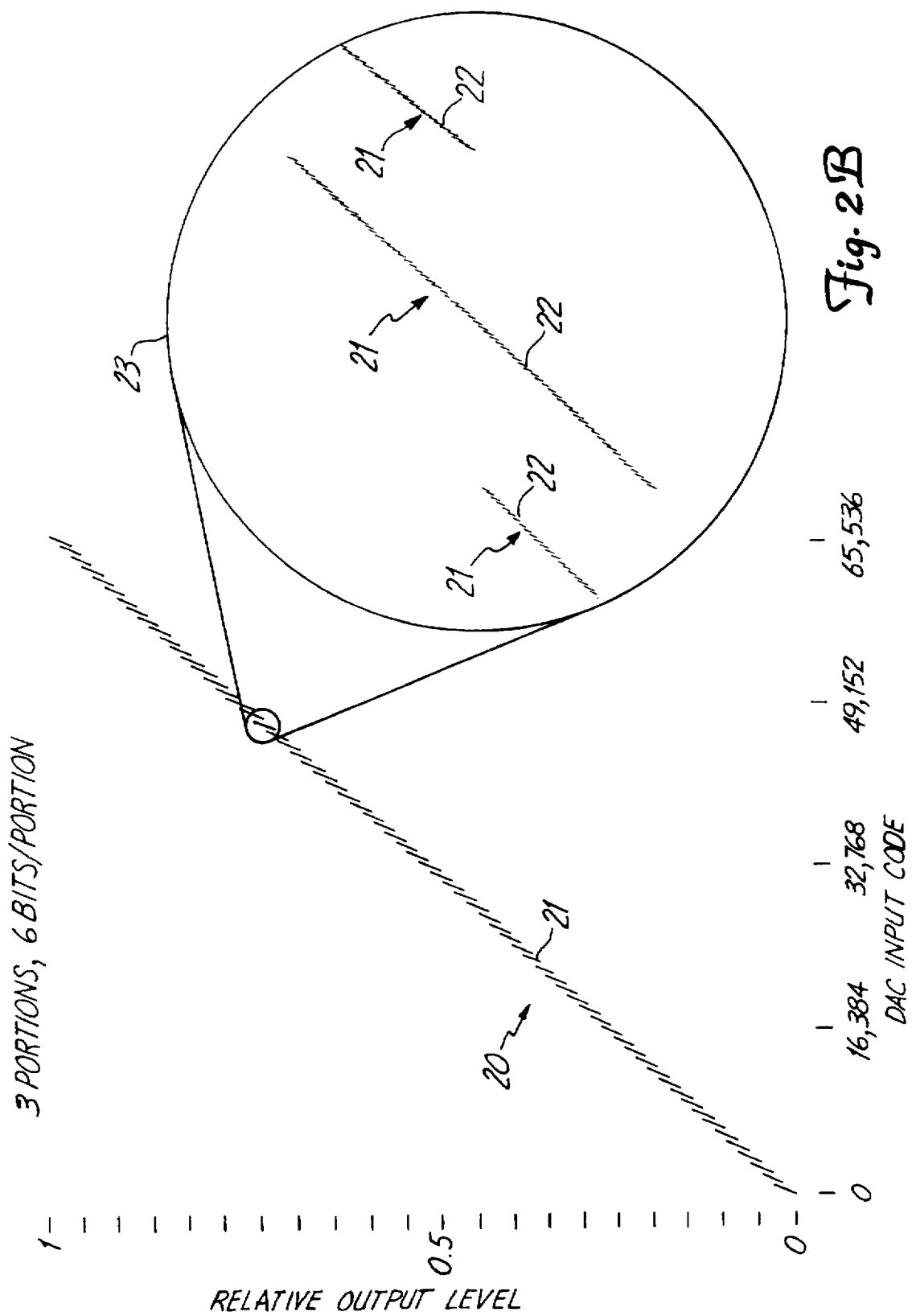

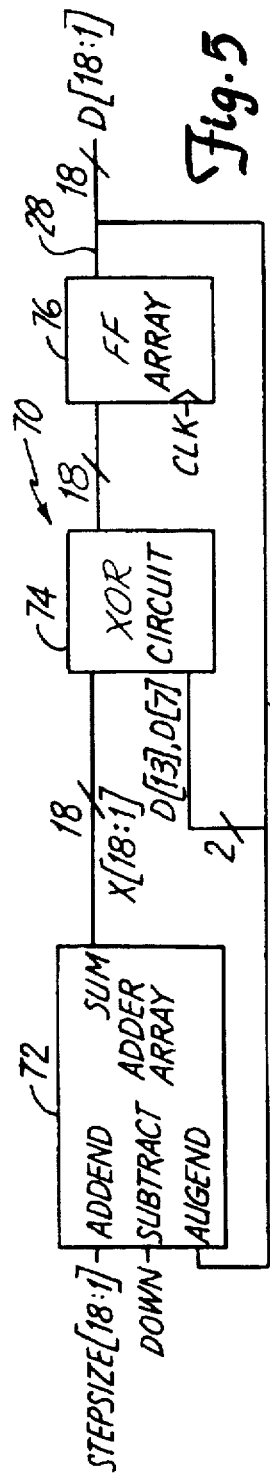
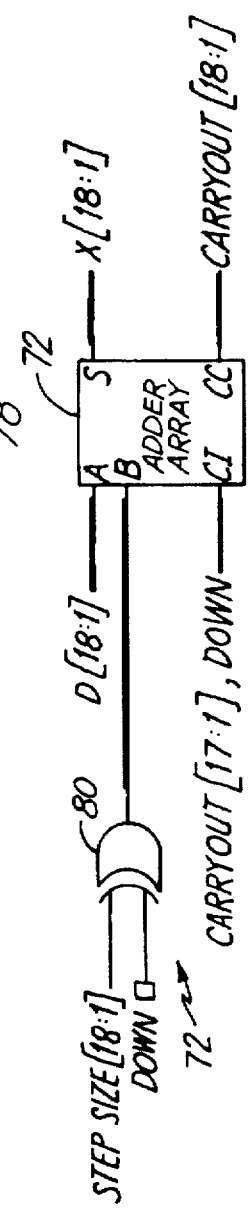
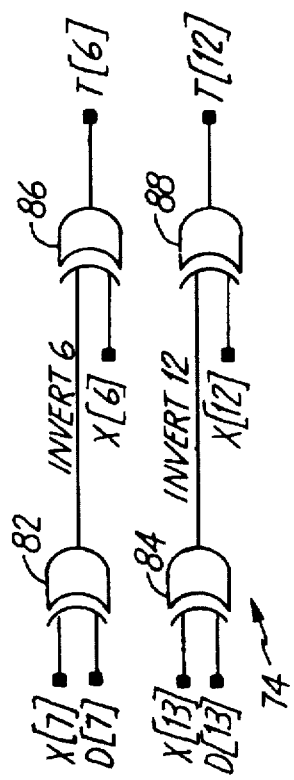
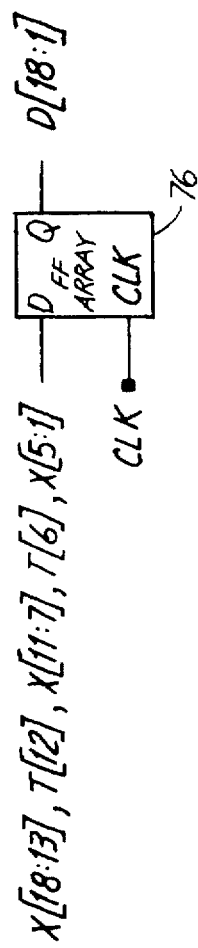
Fig. 5
Fig. 6
Fig. 7
Fig. 8

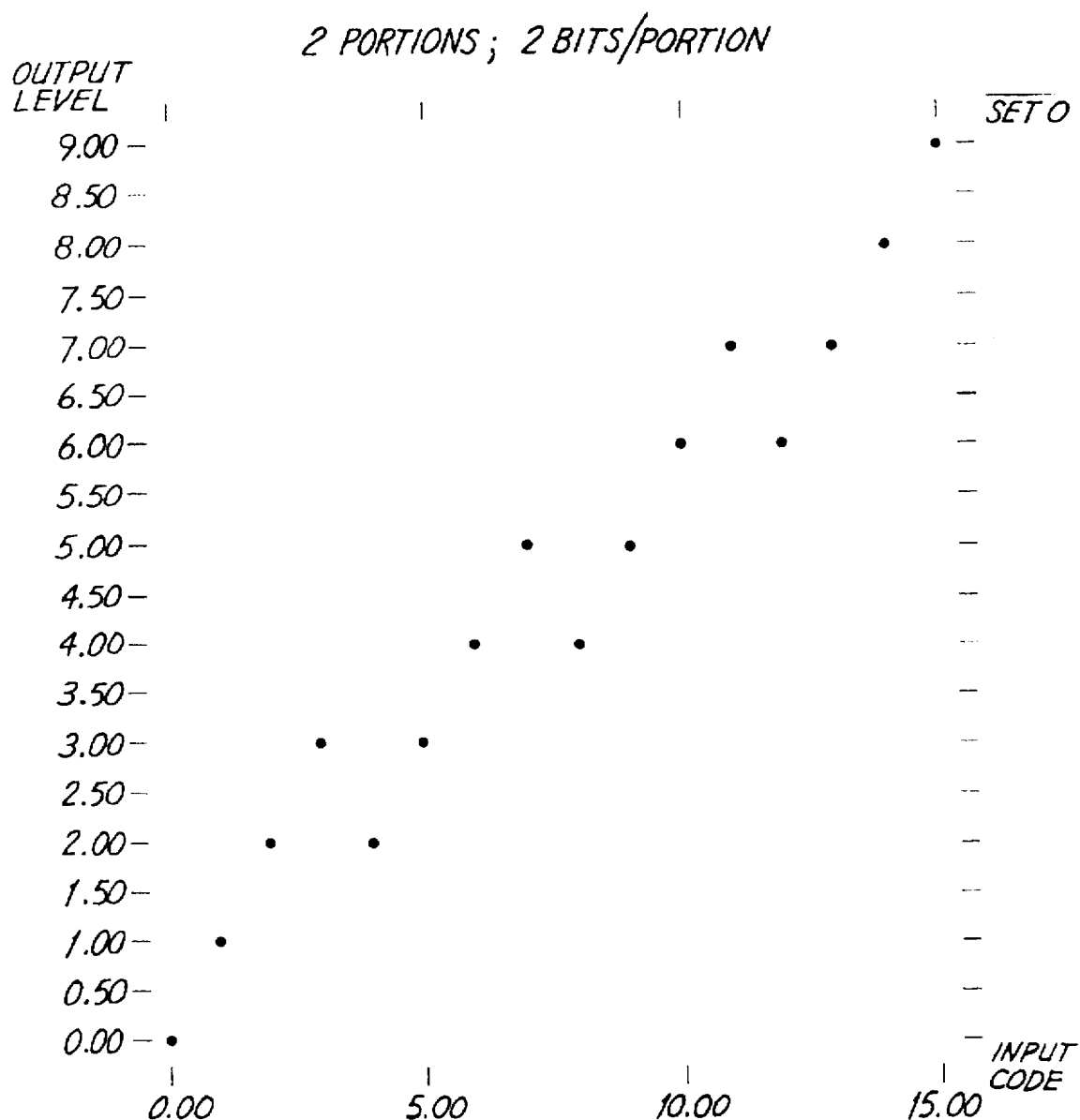

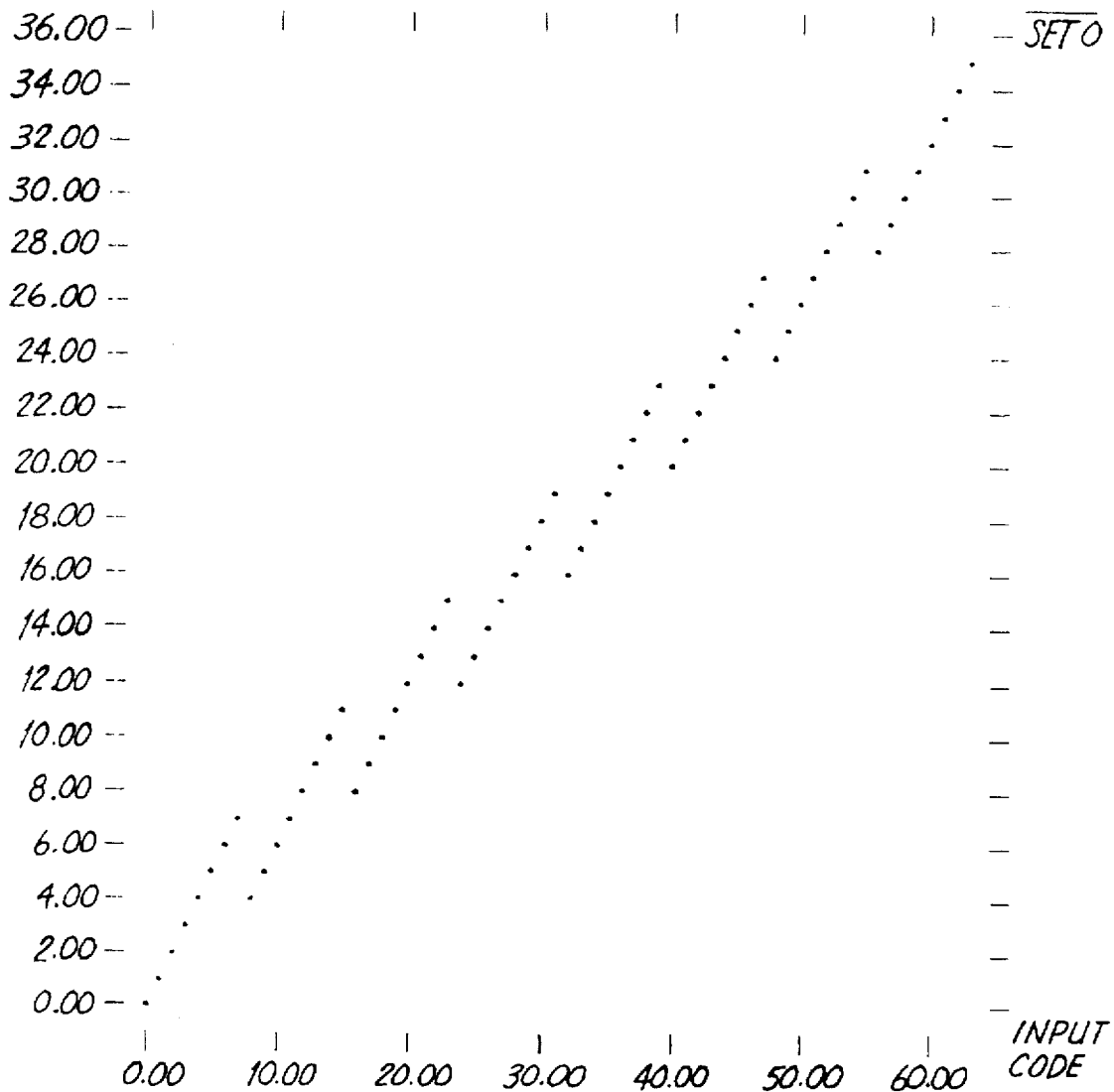

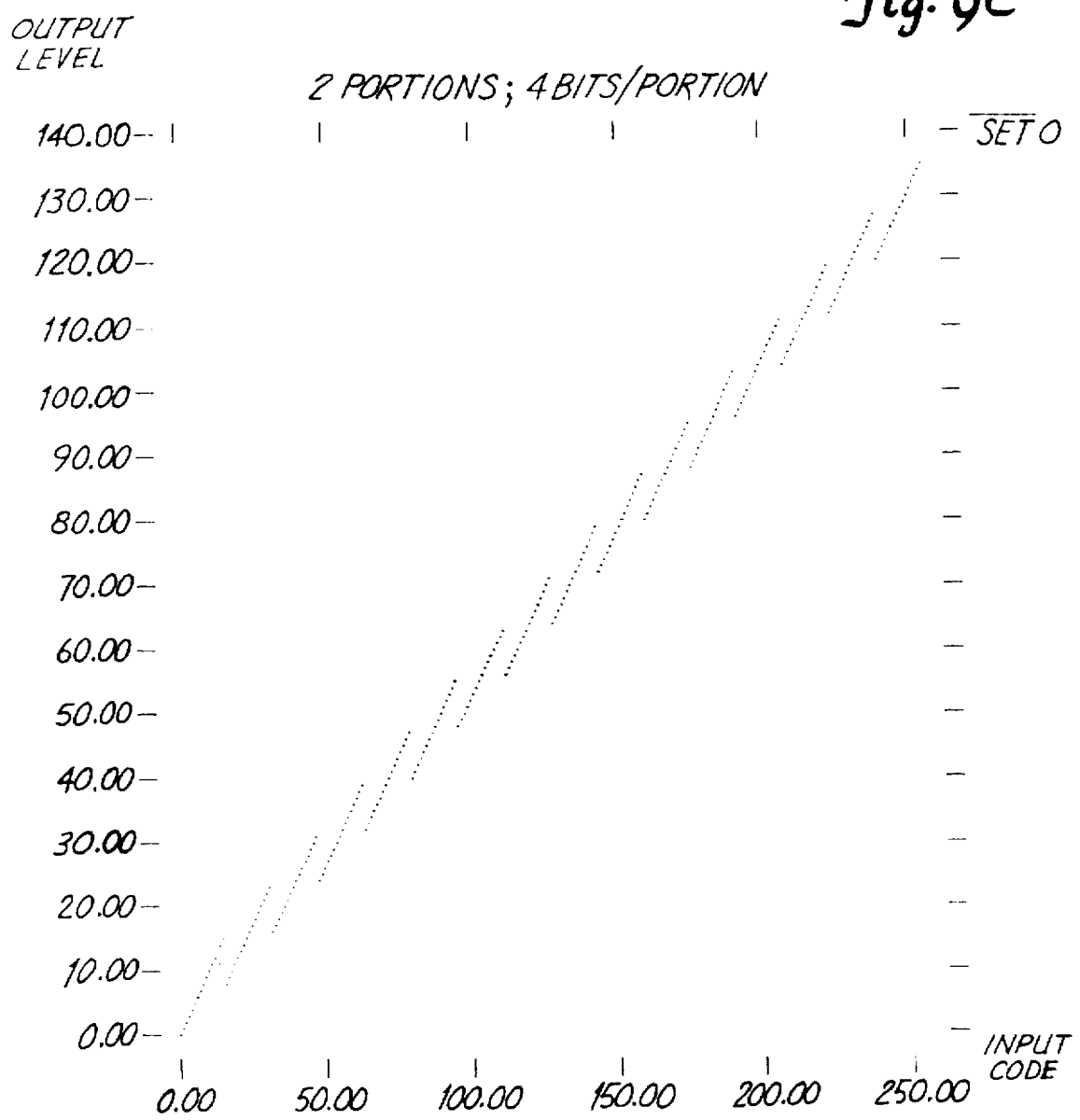

DIGITAL-TO-ANALOG CONVERTER HAVING OVERLAPPING SEGMENTS

BACKGROUND OF THE INVENTION

The present invention relates to digital-to-analog converters (DACs). More particularly, the present invention relates to an integrated circuit DAC which has a segmented transfer function, and which achieves guaranteed local monotonicity over each segment while also requiring much less area and being less expensive to fabricate than conventional DACs of equal resolution.

Conventional objectives for DACs have been the achievement of monotonicity, high linearity, low area, low manufacturing cost and high resolution, or number of bits. A monotonic DAC has an increase in the analog output of the DAC for each increase in the digital input value. In "servo" control loop applications, the digital input modulates within a range of values while maintaining a control loop characteristic at a target level. Monotonicity through this region is particularly important.

One type of conventional DAC employs a resistor tree or a combination of resistor trees. There are several types of resistor trees, including a weighted resistor type (i.e., resistors having relative values in a ratio of R, R/2, R/4, R/8, etc.), an R-2R type and an R-2R-4R-8R type. Conventional DAC architectures provide an accurate way of converting digital words to corresponding analog output signal values.

Monotonicity as well as good linearity for a DAC may be achieved by replicating identical signal source elements of the DAC. However, these architectures are expensive in terms of cost, area on an integrated circuit and the number of elements required to be duplicated for high resolution DACs. The number of elements can be reduced if the DAC is split into two identical portions and the lower order portion is weighted such that its full-scale output nearly equals the output corresponding to the least-significant bit of the upper order portion. However, a conventional portioned DAC may be subject to a discontinuity at the boundary between the portions which is caused by inaccuracies in the weighting of portions. When an n-bit DAC consisting of $2^N$ signal source elements is split into two weighted portions, the number of required signal source elements drops to $2*2^{N/2}$. When split into three weighted portions, the number of required signal source elements drops to $3*2^{N/3}$. For N=18, a DAC requires 262,144 signal source elements when made from a single portion, 1024 elements when made from two portions, and just 192 elements when made from three portions. While effectively reducing the number of elements in and size of the overall DAC when split into two or more portions, there remains the extreme difficulty of maintaining monotonicity, particularly at those points in the DAC's transfer function when all the bits in one portion turn off, and the lowest-order bit in the next higher order portion turns on.

An example of the complexities, possible approaches to design and trade-offs encountered by designers of integrated circuit DACs is provided in an article entitled, "An All-Digital Phase-Locked Loop with 50-Cycle Lock Time Suitable for High-Performance Microprocessors", by Jim Dunning et al., published in the *IEEE Journal of Solid State Electronics*, vol 30, No. 4, April 1995, at page 412.

SUMMARY OF THE INVENTION

The digital-to-analog converter of the present invention avoids many deficiencies of conventional DACs. The DAC of the present invention includes at least two DAC portions which divide the digital word into a least significant word portion $n_1$ and a most significant word portion $n_2$. The word portions overlap in that the weight of the most significant bit (msb) of word portion $n_1$ is the same as the weight of the least significant bit (lsb) of word portion $n_2$. The converter detects when the lsb of word portion $n_2$ changes state, and responsively inverts the state of the msb of word portion $n_1$. Word portions $n_1$ and $n_2$ are then translated into respective analog values which are summed together.

An advantage of the present DAC is that the word overlap results in a segmented transfer function having no analog output values for which the DAC cannot reach by an appropriate digital word value. Also, transitions between word portions are detected and a selected transition path from one segment to the next in the transfer function is followed so that differential non-linearity error in the transfer function over the DAC's entire range is low, and monotonicity over each segment in the transfer function can be guaranteed.

BRIEF DESCRIPTION OF THE DRAWINGS

FIG. 2A is a block diagram of a DAC according to the present invention.

FIGS. 2B and 2C are graphs of the transfer function between digital word value and analog signal level of the DAC shown in FIG. 2A.

FIGS. 5–8 are schematic diagrams which illustrate bit mapping between overlapping DAC portions.

DETAILED DESCRIPTION OF THE PREFERRED EMBODIMENTS

Figure 1:
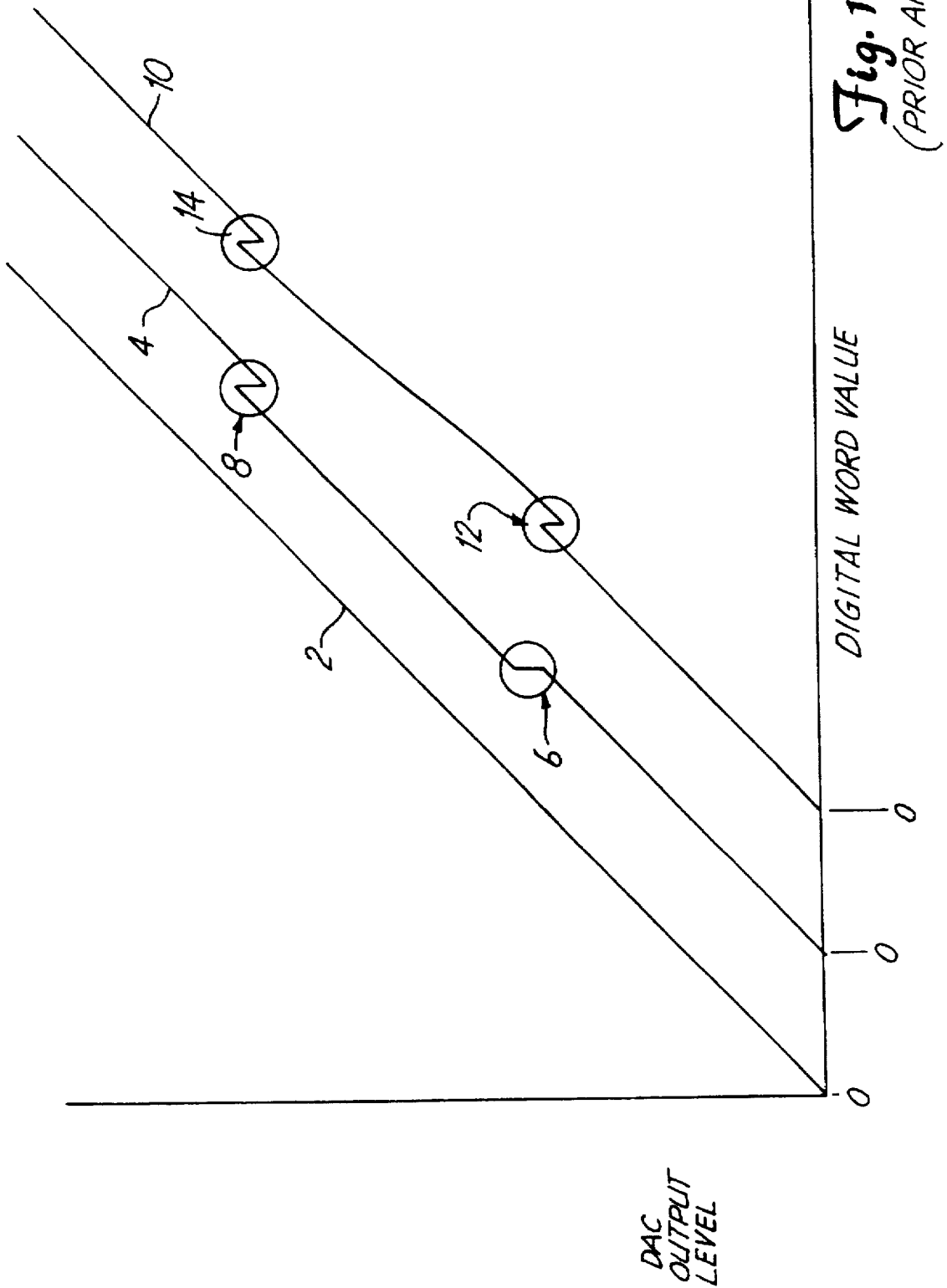
FIG. 1 is a graph which compares the output analog signal level versus digital word value of a hypothetical perfect DAC and of two conventional DACs.

FIG. 1 is a graph which compares the output analog signal level of a hypothetical perfect DAC with two conventional DACs having segmented transfer functions. In order to present these graphs together, the zero value for each line is displaced slightly from the others along the horizontal axis. Line 2 represents a graph of analog output signal level versus digital word value for a hypothetical perfect digital-to-analog converter (DAC). In line 2, there is a singular analog output signal value for every digital word value. All analog signal values are obtainable by an appropriate digital word value. This is a perfect DAC and can be substantially achieved by use of the conventional DAC circuit architecture described above, but requiring $2^N$ elements. However, this conventional DAC architecture is expensive and requires a large space on an integrated circuit if digital words of large bit count are to be translated.

Line 4 represents the output from a conventional DAC having three segments in the transfer function. All three segments have substantially the same slope but do not transition perfectly with one another. At 6, the transition between the lowest and middle segments shows a step discontinuity in which the segments do not overlap one another in the vertical direction (i.e., in the direction of analog output signal level value). This step discontinuity 6 represents a range of analog output signal levels which are not achievable in response to any particular digital word value. At 8, the output signal level of the middle segment has an overlap discontinuity with the output signal level of the highest segment. Thus, the highest and middle segments each provide output signal levels in response to a digital word value falling at this discontinuity. The overlap at 8 represents a loss of monotonicity for the DAC.

Line 10 represents the output signal level from another conventional DAC having three segments. Again, the segments do not transition perfectly with one another. The lowest segment and the highest segment may have the same or similar slopes. The middle segment has a differing slope and does not intersect with the lowest and highest segments at the transitions between these segments. At 12 and 14, the output levels of the adjacent segments overlap one another in the vertical (analog signal level) direction so that this DAC exhibits non-monotonicity and considerable non-linearity.

FIG. 2A is a block diagram of a three-portion, 6-bit per portion DAC 15 according to the present invention. DAC 15 receives a digital input word D[18:1] for conversion into a corresponding analog value. DAC 15 has portions 16a, 16b and 16c which receive bits D[12:7], D[6:1] and D[18:13], respectively. The outputs of portions 16a, 16b and 16c are scaled by factors of unity, $\frac{1}{2}^{N-1}$ and $2^{N-1}$, where N is the number of bits per portion. These scaling factors represent the mathematical relationship of bits D[12:7], D[6:1] and D[18:13]. DAC portion 16c is the lowest order portion. The scaling factor is applied to the output of portion 16c at block 17. With six bits per portion, the scaling factor for block 17 is $\frac{1}{32}$. DAC portion 16a is an intermediate order portion and has a scaling factor of unity. DAC portion 16b is the highest order portion. The scaling factor is applied to the output of portion 16b at block 18. With six bits per portion, the scaling factor for block 18 is 32. The scaled analog outputs of portions 16a, 16b and 16c are then added at sum node 19.

Figure 2C:
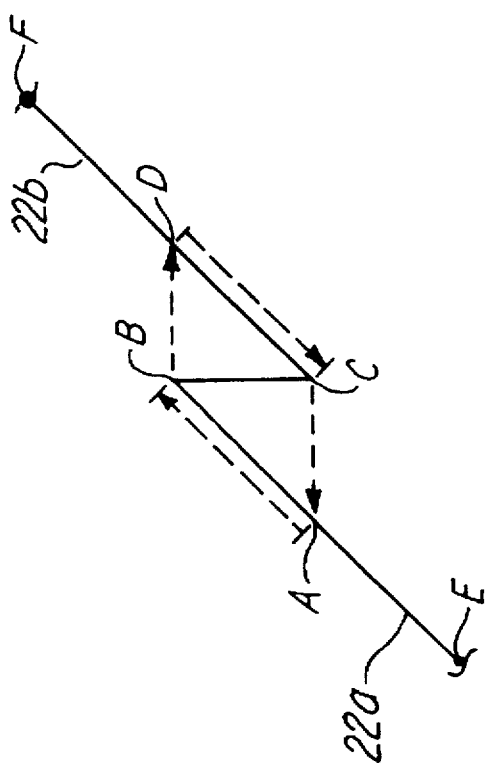

FIG. 2B is a graph of the transfer function of the DAC shown in FIG. 2A. Line 20 represents the relative analog output of DAC 15 over the range of digital input values. Line 20 is formed of a plurality of overlapping segments 21. Since there are three portions in DAC 15, each segment 21 is, in turn, formed of a plurality of overlapping segments 22, as shown in detail area 23. FIG. 2C is a more detailed graph of the transfer function shown in FIG. 2B, which illustrates a transition between individual segments 22. Segments 22a and 22b overlap at points B and C.

In order to ensure that all DAC output levels are reachable, the weighting of the lower-order portion has been increased a factor of 2 over a conventional DAC. This weighting causes segments to overlap in the resulting DAC transfer function. In a conventional DAC, such an overlap would normally increase non-monotonicity. Although the overlap creates a discontinuous transition from B-to-C, the DAC of the present invention maintains local monotonicity from E-to-B and from C-to-F while forcing the DAC transfer function to transition from A-to-B-to-D or D-to-C-to-A, as opposed to B-to-C or C-to-B.

These transitions are particularly useful when the DAC is used in a servo loop application in which the digital control word applied to the DAC input is adjusted to maintain a measured control loop characteristic at a target level. The lower order bits of the digital control word experience local modulation while maintaining the measured characteristic at the target level. If, for example, the local modulation is in a lower segment in the transfer function, between E and B, and then the modulation drifts up to the discontinuity at B–C, the modulation will jump from B to D. Thereafter, the digital control word will modulate between C and F, rather than modulating across the discontinuity at B–C. As a result, local modulation along E–B and C–F remains monotonic, even if the modulation crosses the discontinuity at B–C. Also, the transition from one level to the next places the region of modulation at the middle of the next level, rather than at the lower edge of the next level. This allows for substantial drift in the region of modulation without encountering an upper or lower transition across segments.

The present invention achieves these transitions by dividing the digital word into at least two overlapping word portions, with each word portion being decoded into an analog value by a corresponding binary weighted DAC circuit portion. Whenever the state of the least significant bit of the higher order word portion is changed, the most significant bit of the lower order word portion is forced to an opposite state from what it otherwise would have.

For example, a DAC having three word portions and providing 16-bit resolution would include 18 bits, with adjacent bits on opposite sides of each word portion having the same binary weight. Bits 1–6 would correspond to the word portion of lowest significance, bits 7–12 would correspond to the word portion of intermediate significance and bits 13–18 would correspond to the word portion of highest significance. At the transitions, bits 6 and 7 have the same binary weight and bits 12 and 13 have the same binary weight (i.e., $2^5$ and $2^{10}$, respectively). In the example of increasing digital word values, bits 1–6 fill to the limit of the lowest word portion and are cleared as the intermediate word portion is incremented by toggling bit 7 from a "0" to a "1". Thus, once all low order bits 1–6 become "1's" and bit 7 goes from a "0" to a "1", bit 6 would normally be cleared from "1" to "0" along with bits 1–5. The DAC of the present invention inverts bit 6 from "0" back to "1". The word portion of lower significance is now filled to one half its full capacity.

As a result, the DAC of the present invention has no analog output signal values which cannot be reached by providing an appropriate digital word value and has continuous transitions from one segment in the transfer function to the next. By overlapping the three word portions by one bit, 18 bits gives true 16-bit resolution for the DAC. Since each circuit portion of the DAC only handles 6 bits, the value of $2^N$ elements for each circuit portion is only $2^6$, or 64, which results in a total of 192 elements for three circuit portions rather than the $2^{16}$, or 65,536 elements which would be required for a conventional binary-weighted DAC having an unsegmented transfer function. With the present invention, if the higher order word portion has N bits, the lower order word portion has M bits and the higher order word portion overlaps the lower order word portion by one bit, the DAC transfer function will have $2^N$ overlapping segments, with each segment having $2^M$ levels.

Figure 3:
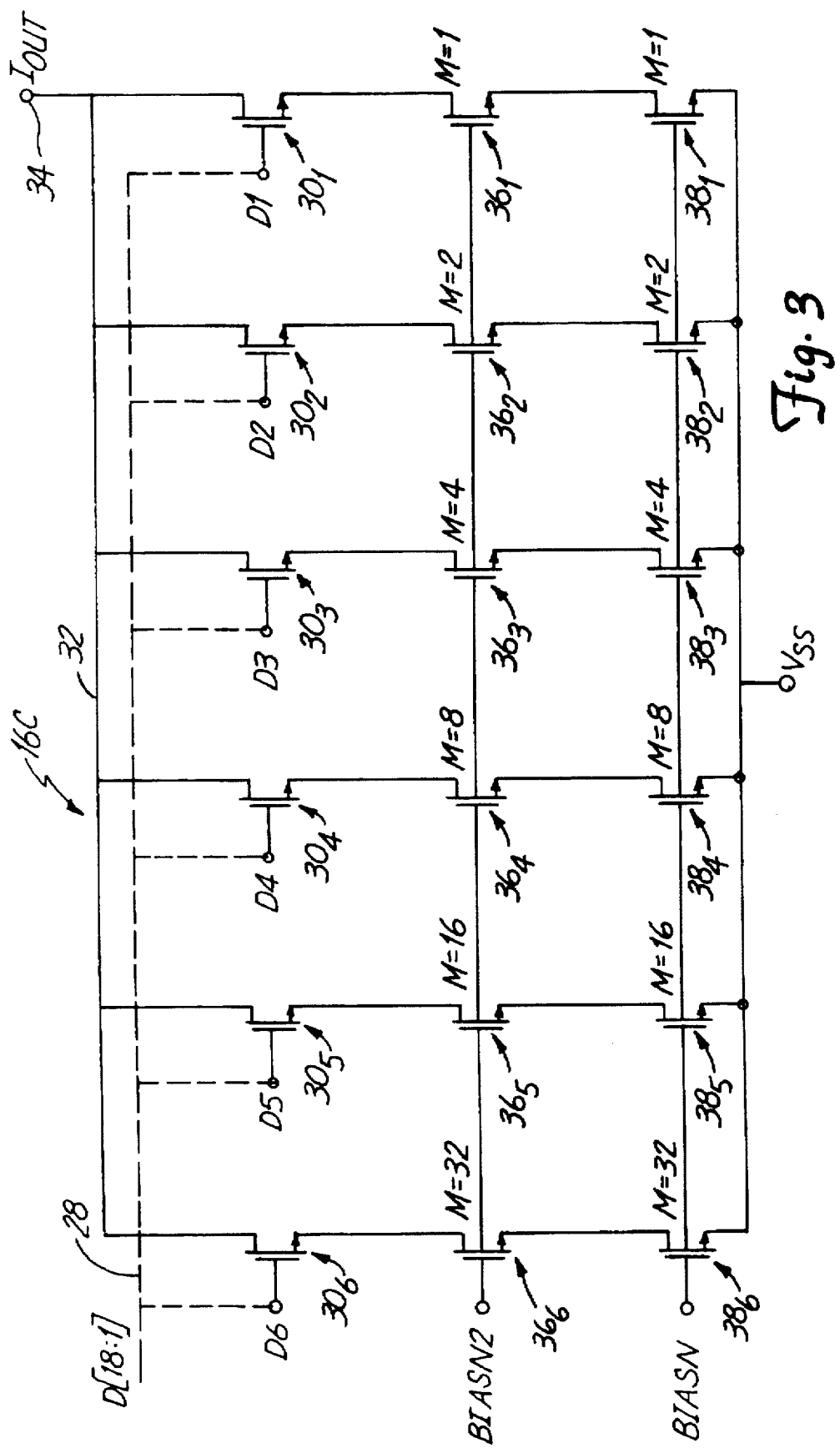
FIG. 3 is a schematic circuit representation of one circuit portion of a DAC circuit according to the present invention.
Figure 4:
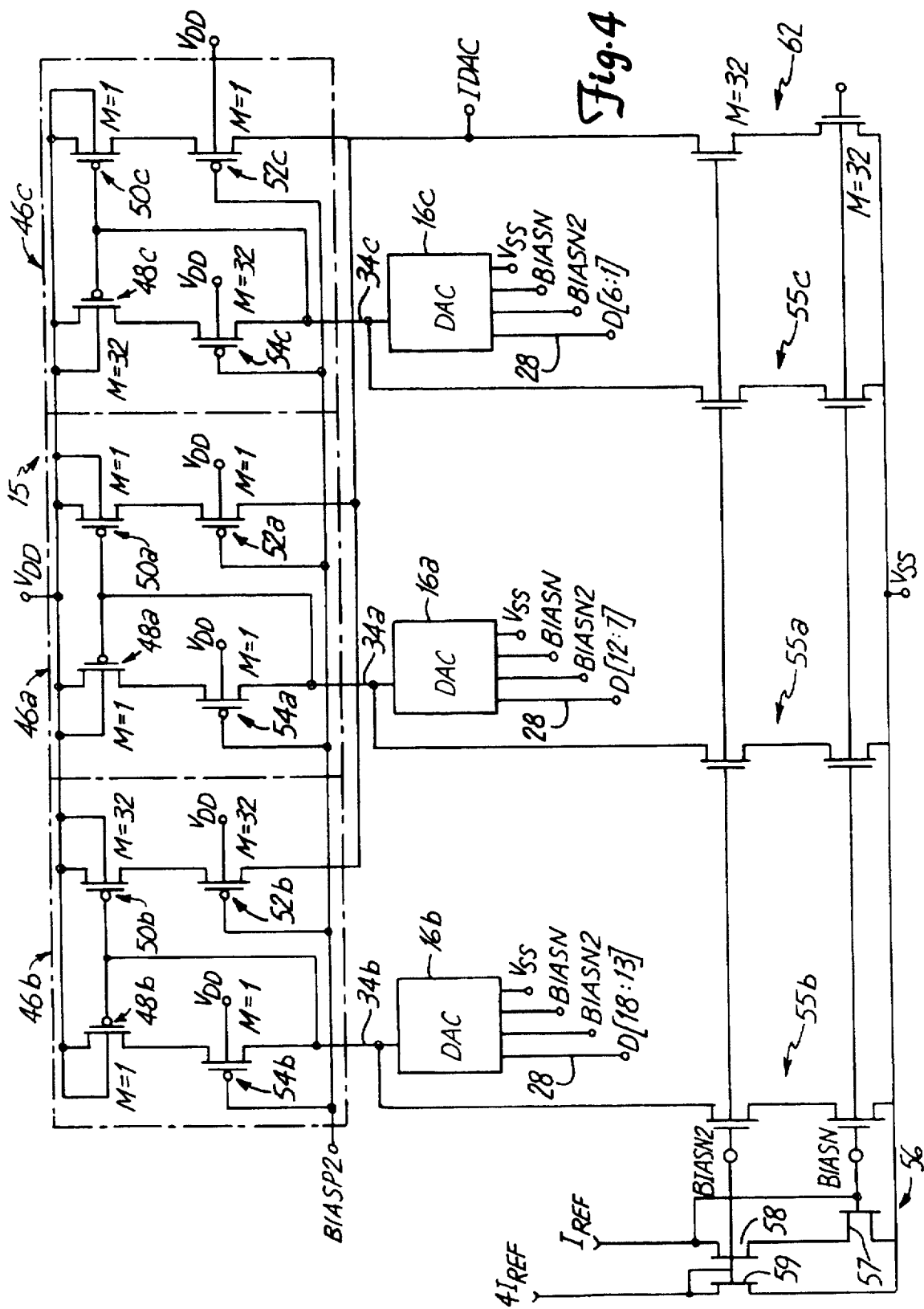
FIG. 4 is a schematic circuit representation of a DAC embodying the present invention, and including three circuit portions as depicted in FIG. 3.

FIGS. 3 and 4 are schematic diagrams of DAC 15. FIG. 3 illustrates one 6-bit DAC circuit portion 16c. Portion 16c receives bits D[6:1] of digital input word D[18:1], which is provided to the DAC on parallel interface 28. Bits D[6:1] are applied to nodes D6 through D1. Each node D1–D6 is coupled to a respective control terminal of bit-decode transistors $30_1$–$30_6$. Transistors $30_1$–$30_6$ form an array of switches which are operated by the respective bits of the digital input provided on interface 28. Transistors $36_1$–$36_6$ and $38_1$–$38_6$ are coupled between corresponding transistors $30_1$–$30_6$ and ground terminal VSS. Transistors $36_1$–$36_6$ and $38_1$–$38_6$ form an array of cascoded, weighted, controlled current sources for the associated bit-decode transistors $30_1$–$30_6$. The state of each bit at nodes D1–D6 determines which current source or combination of current sources is coupled to and summed at output terminal 34.

Bias lines BIASN and BIASN2 are coupled to the control terminals of transistors $36_1$–$36_6$ and $38_1$–$38_6$, respectively. BIASN sets the full scale output current level of the DAC. BIASN2 keeps the drain-source voltage drop of transistors $38_1$–$38_6$ constant, equal and above the saturation voltage $V_{DS,sat}$. Bias lines BIASN and BIASN2 are generated by a bias circuit which is discussed in more detail in FIG. 4.

Each transistor $36_1$–$36_6$ and $38_{1-386}$ has an associated multiplication factor "M" which indicates the number of instances of that transistor in the array. For example, transistor $38_4$ has an M factor of eight, which indicates that there are eight transistors $38_4$ connected together in parallel. The transistors $36_1$–$36_6$ and $38_1$–$38_6$ have multiplication factors that are selected to provide successively larger current supply capacities in a 2:1 ratio from one to the next in the order from transistor $36_1$ to transistor $36_6$ and transistor $38_1$ to transistor $38_6$, as indicated by the increasing M factor.

FIG. 4 is a schematic diagram of DAC 15, which includes three 6-bit DAC circuit portions 16a–16c. Portions 16a, 16b and 16c receive bits D[12:7], D[18:13], and D[6:1], respectively, of the digital input D[18:1] from parallel interface 28. The output of each DAC circuit portion 16a–16c is applied to an associated weighted current mirror 46a–46c. Current mirrors 46a–46c include transistors 48, 50, 52 and 54. DAC circuit portion 16a sinks an output current through transistors 48a and 54a, which is mirrored into transistors 50a and 52a. Each transistor 48a, 50a, 52a and 54a has an M factor of one. Thus, the output current flowing from DAC 16a through transistors 48a and 54a is multiplied or weighted by unity when mirrored into transistors 50a and 52a.

DAC 16b sinks current through transistors 48b and 54b of current mirror 46b. Transistors 48b and 54b have an M factor of one while transistors 50b and 52b have an M factor of 32. Thus, the output current from DAC 16b is multiplied by 32 when mirrored into transistors 50b and 52b.

DAC 16c sinks current through transistors 48c and 54c of current mirror 46c. Transistors 48c and 54c have an M factor of 32 while transistors 50c and 52c have an M factor of one. The output current from DAC portion 16c is divided by 32 when mirrored into transistors 50c and 52c. Therefore, the circuit portions of DAC 15 have scale factors of 1/32, 1 and 32. This is the same mathematical scaling relationship existing between the 16-bit values of 18-bit digital words expressed by bits 1–6, 7–12 and 13–18, respectively. The outputs of current mirrors 46a–46c are summed at output node IDAC.

DAC 15 further includes an array of current mirror transistors 55a–55c and a bias circuit 56 which biases the transistors such that the transistors are always slightly on and pulling a small amount of current, regardless of the DAC input code. Circuit 56 includes transistors 57, 58 and 59. In one embodiment, transistors 57, 58 and 59 have the same length and width. Transistors 57 and 58 receive a bias current $I_{REF}$ while transistor 59 receives a bias current $4I_{REF}$. Since the current flowing through transistor 59 is four times the current flowing through transistor 57, BIASN2 has a voltage that is higher than the BIASN voltage, which pulls the drain of transistor 57 (and transistors $38_1$–$38_6$ in FIG. 3) above $V_{DS,sat}$. BIASP2 is generated by a bias circuit in a similar fashion as BIASN and BIASN2. BIASP2 biases transistors 52 and 54 such that the drain-source voltage $V_{DS}$ of transistors 48 and 50 are constant, substantially equal, and above the saturation voltage $V_{DS,sat}$. Circuit 56 is one example of a circuit for generating BIASN and BIASN2 from a reference current $I_{REF}$. Other circuits can also be used.

Since transistors 52, 54 and 55a–55c are always on, there will be a small amount of current being pulled up from output node IDAC even when the value of the digital input to DAC 14 is zero. Current mirror transistors 62 are coupled between output node IDAC and voltage supply terminal VSS. Transistors 62 are biased to offset the pull up current on output IDAC when a zero digital value is supplied to the input of the DAC. In one embodiment, transistors 62 are sized such that the net current at node IDAC is zero for a zero input value.

FIG. 5 is a schematic diagram which illustrates a bit mapping circuit for mapping bits between the overlapping DAC circuit portions 16a–16c, according to one embodiment of the present invention. Bit mapping circuit 70 includes adder array 72, exclusive-OR ("XOR") circuit 74, output flip-flop array 76 and parallel interface 28. Bit mapping circuit 70 provides an 18-bit digital input word D[18:1] at parallel interface 28 for translation into analog form by DAC 15 (FIG. 4).

Adder array 72 includes an array of 18 individual adder elements which are coupled together to form a ripple carry full adder. Adder array 72 includes an ADDEND input, a SUBTRACT control input, an AUGEND input and a SUM output. Adder array 72 receives the present digital input word D[18:1] at the AUGEND input from feedback line 78 and adds or subtracts the value of a STEPSIZE signal provided on the ADDEND input as a function of the value of a DOWN signal provided on the SUBTRACT control input. If DOWN=0, adder array 72 adds the ADDEND and the AUGEND. If DOWN=1, adder array 72 subtracts the ADDEND from the AUGEND. In one embodiment, the value of the STEPSIZE signal is a binary one. The STEPSIZE and DOWN signals are supplied by a control circuit (not shown), such as a "servo" control circuit. The resulting sum is provided on the SUM output as an "expected" digital input word X[18:1]. This word is expected to be the next word that is provided to the DAC on parallel interface 28 for translation into an analog value.

Adder array 72 is shown in greater detail in FIG. 6. The carry in (CI) and carry out (CO) pins of individual adder elements are connected to adjacent adder elements to implement the ripple carry function. The DOWN signal is provided to the first CI pin and to XOR gate 80 to perform a two's complement subtraction of STEPSIZE[18:1] from D[18:1] when DOWN=1.

Referring back to FIG. 5, the expected bits X[18:13,11:6, 5:1] are passed without alteration through XOR circuit 74 to output flip-flop array 76. Bits X[12,6] are toggled, or inverted, within XOR circuit 74 depending upon whether bits D[13,7] are expected to change from their present states, which would indicate a transition from one segment in the DAC transfer function to the next. FIG. 7 shows XOR circuit 74 in greater detail. XOR circuit 74 includes XOR gates 82, 84, 86 and 88. Expected bits X[7] and X[13] are fed to XOR gates 82 and 84 and are compared with present bits D[7] and D[13]. If there is a change in state from the present value to the expected value in either bit, the respective XOR gate 82 or 84 generates a logic high level on its output INVERT6 or INVERT12 which toggles, or inverts, the corresponding overlap bit X[6] or X[12] at XOR gates 86 and 88. The toggled bits T[6] and T[12] are then combined with X[18:13, 11:7,5:1] at the input of flip-flop array 76, as shown in FIG. 8.

FIG. 8 shows flip-flop array 76 in greater detail. Flip-flop array 76 includes an array of 18 flip-flops, such as D-type flip flops, with one flip-flop for each bit in the input word.

The following example shows how bit mapping circuit 70 forces the DAC transfer function to follow transitions A-to-B-to-D and D-to-C-to-A in FIG. 2. In this example, STEPSIZE=1. Looking at bits 18:1, points A, B, C or D on FIG. 2 have the following codes:

A XXXXXX XXXXX0 011111
B XXXXXX XXXXX0 111111
C XXXXXX XXXXX1 000000
D XXXXXX XXXXX1 100000

In the increment direction, the transition,

B XXXXXX XXXXX0 111111 to

C XXXXXX XXXXX1 000000 becomes the transition (after the inversion of bit 6),

B XXXXXX XXXXX0 111111 to

D XXXXXX XXXXX1 100000

Likewise, in the decrement direction the transition,

C XXXXXX XXXXX1 000000 to

B XXXXXX XXXXX0 111111 becomes the transition (after the inversion of bit 6,

C XXXXXX XXXXX1 000000 to

A XXXXXX XXXXX0 011111

The imminence of a discontinuous transition is detected by bit mapping circuit 70 by detecting a change in state of bits 7 and 13, which represent a B-to-C or C-to-B transition. As the DAC control word is increased or decreased, the DAC analog output therefore makes a continuous transition from level A-to-B-to-D or D-to-C-to-A. When used in certain "servo" applications, the DAC input will tend to remain within a locally monotonic region. Infrequently, the "servo" loop will cause the DAC to "jump" from one locally monotonic region to an adjacent monotonic region. Bit mapping circuit 70 accomplishes this jump cleanly.

The DAC of the present invention may have two or more circuit portions and each portion may have two or more bits. The number of circuit portions depends on a trade-off between the number of circuit elements saved by each portion and the number of added circuit elements required for associated circuitry, in view of the size of the digital words to be decoded with a particular DAC.

Figure 9D:
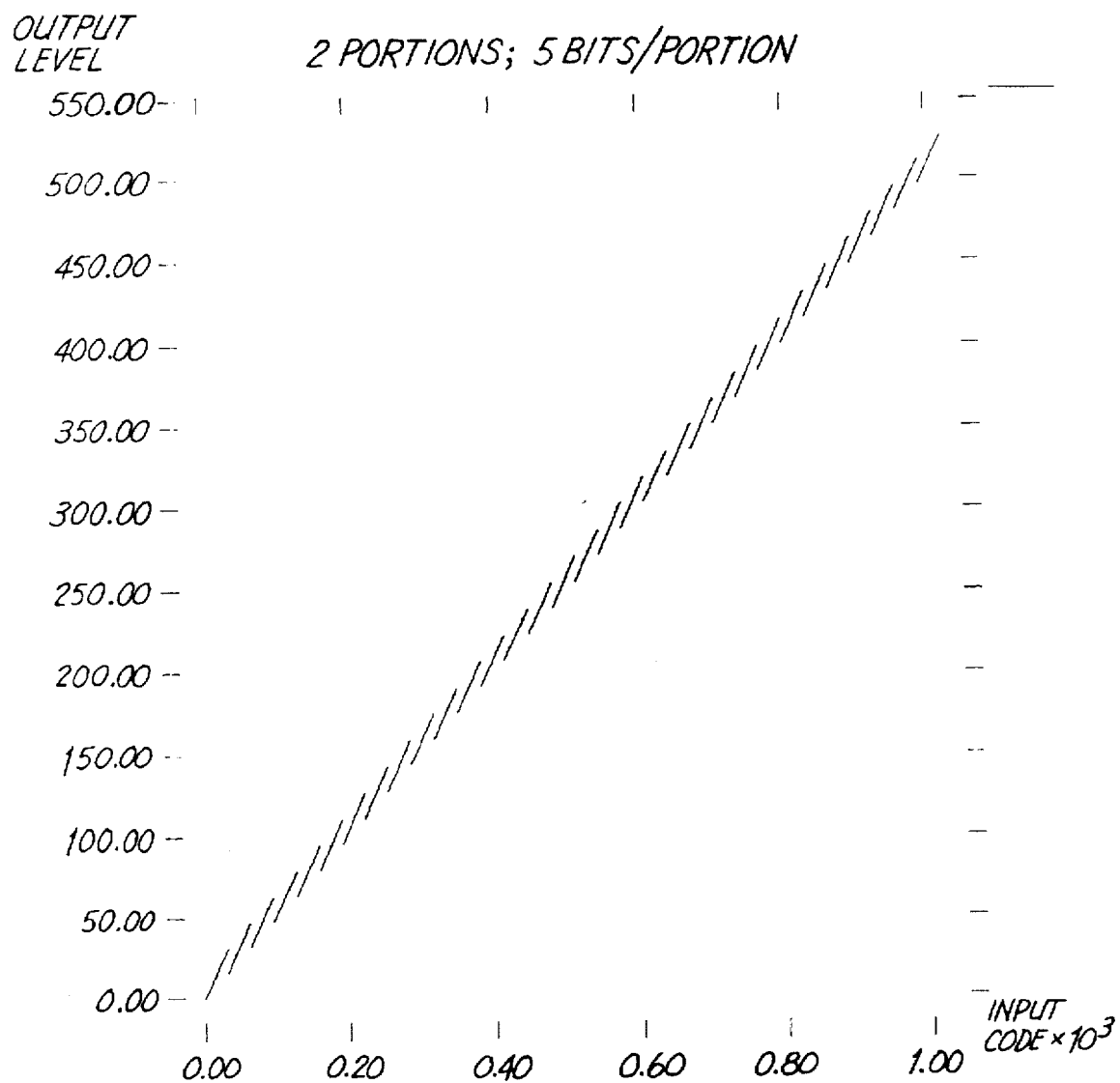
FIGS. 9–9F are graphs which illustrate the transfer functions of DACs having various numbers of portions and various numbers of bits per portion, according to the present invention.
Figure 9E:
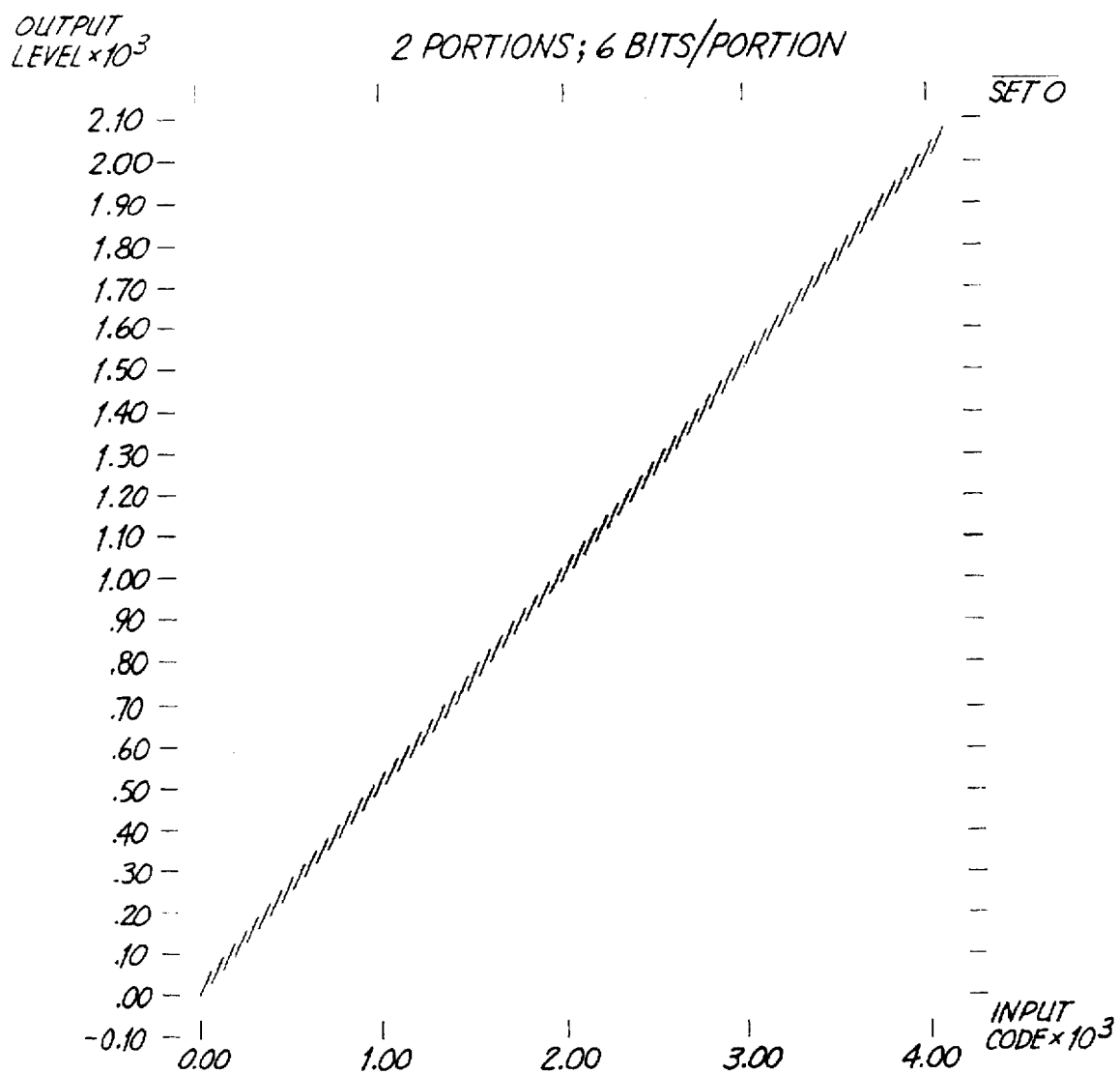
Figure 9F:
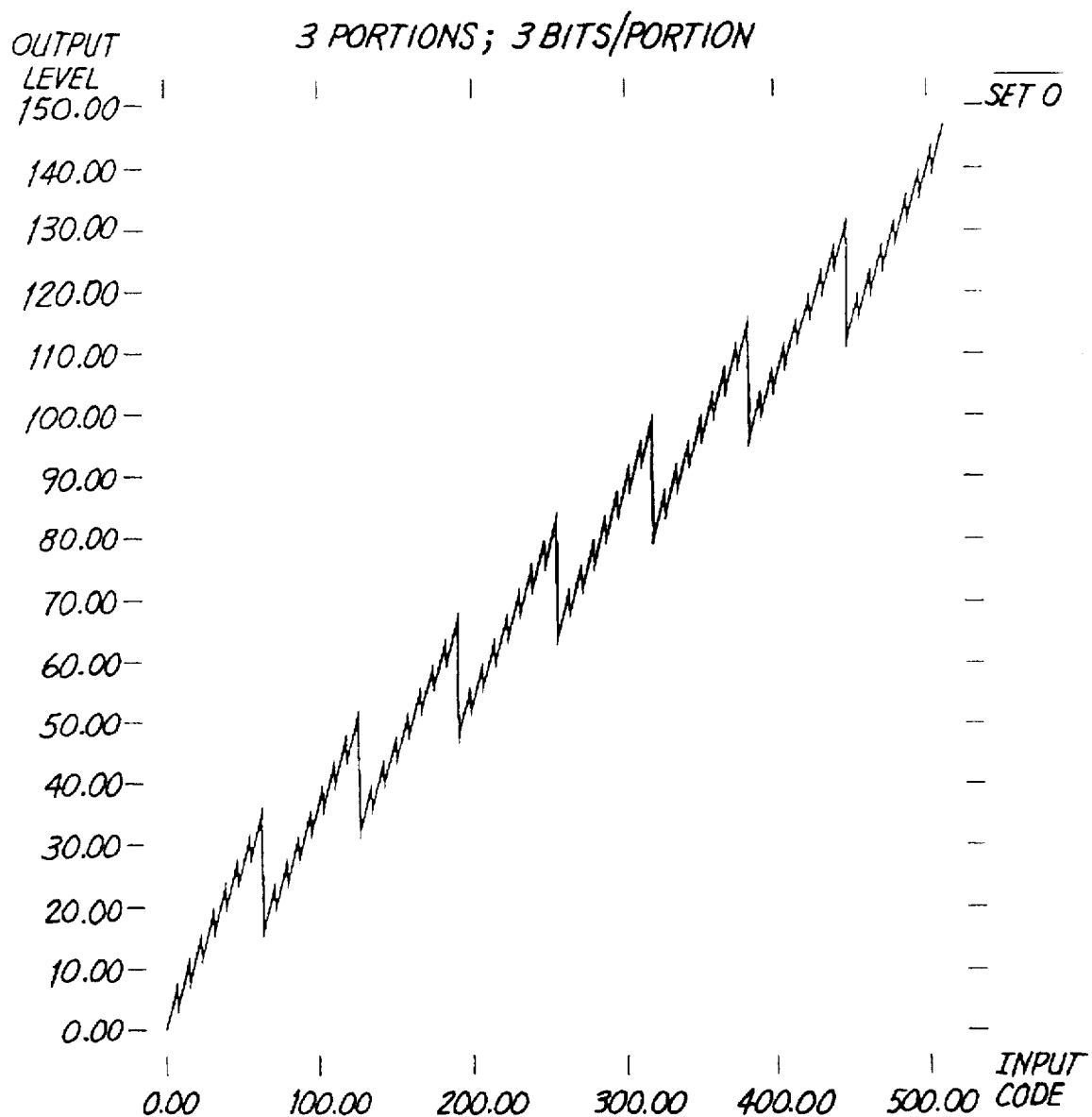

FIGS. 9A–9F are graphs which illustrate the transfer functions of DACs having various numbers of portions and various numbers of bits per portion, according to the present invention. In FIG. 9A, there are two portions, with two bits per portion; in FIG. 9B, there are two portions, with three bits per portion; in FIG. 9C, there are two portions, with four bits per portion; in FIG. 9D, there are two portions, with five bits per portion; in FIG. 9E, there are two portions, with six bits per portion; in FIG. 9F, there are three portions, with three bits per portion.

Although the present invention has been described with reference to preferred embodiments, workers skilled in the art will recognize that changes may be made in form and detail without departing from the spirit and scope of the invention. For example, the DAC of the present invention can be implemented with a variety of circuit configurations. The configurations shown herein are provided as examples only. The DAC can be implemented with discrete components or can be implemented wholly or partially in an integrated circuit, such as an application specific integrated circuit (ASIC). The major functions of the DAC, and in particular the bit mapping circuit, can be implemented in hardware or software. For example, the bit mapping circuit can be implemented in a software routine which is performed by a microprocessor. The terms "connected" or "coupled" used in the specification and in the claims can include various types of connections or couplings and can include a direct connection or a connection through one or more intermediate components.

What is claimed is:

1. A digital-to-analog converter (DAC) for translating a sequence of multi-bit digital word into corresponding analog values, the sequence including a current digital word and a new digital word, wherein the DAC comprises:

circuit means for providing the sequence of digital words, each digital word having a digital value and having multi-bit word portions $n_1$ and $n_2$, in which portion $n_1$ is a least significant portion and portion $n_2$ is a most significant portion, and in which the weight of the most significant bit (msb) of word portion $n_1$ is the same as the weight of the least significant bit (lsb) of word portion decoding means for detecting when the lsb of word portion $n_2$ changes state from the current digital word to the new digital word and for decoding the new digital word by responsively inverting the state of the msb of word portion $n_1$ of the new digital word each time the lsb of word portion $n_2$ changes state; and circuit means for translating word portions $n_1$ and $n_2$ of the decoded new digital word into respective analog values and for summing the respective analog values together to provide an analog output indicative of the digital value of the decoded digital word.

2. The digital-to-analog converter (DAC) of claim 1 wherein the the decoding means includes:

a first exclusive-OR gate having a first input receiving the lsb of word portion $n_2$ of the current digital word, a second input receiving the lsb of word portion $n_2$ of the new digital word, and an output; and a second exclusive-OR gate having a first input coupled to the output of the first exclusive-OR gate, a second input receiving the msb of word portion $n_1$ of the new digital word, and an output providing a mapped value for the msb of word portion $n_1$ of the new digital word.

3. The digital-to-analog converter (DAC) of claim 1 wherein the circuit means for translating word portions $n_1$ and $n_2$ into their respective analog values comprises: p1 first and second respective translation circuits, each translation circuit receiving a respective one of the word portions $n_1$ and $n_2$ of the decoded new digital word and responsively providing a respective intermediate analog output signal indicative of the digital value of the word portion; and weighing circuit means receiving the intermediate analog output signal from one of the translation circuits and having a mathematical weighing value in comparison to a weighing value applied to the other of the translation circuits which provides a ratio equal to the ratio of the highest value of word portion $n_1$ to the highest value of word portion $n_2$, the weighing circuit providing an analog weighted output signal indicative of the digital value of the respective word portion.

4. The digital-to-analog converter (DAC) of claim 3 wherein each translation circuit comprises:

an array of switches, wherein the switches in the array are controlled by respective bits in the word portion that is translated by the translation circuit and wherein each switch passes a portion of the intermediate analog output signal; and an array of current source transistors coupled in series with the array of switches, each current source transistor providing current to a respective switch.

5. The digital-to-analog converter (DAC) of claim 4 wherein the array of current source transistors is weighted such that the current provided to each switch has a level corresponding to a relative binary weight of the bit which controls that switch.

6. The digital-to-analog converter (DAC) of claim 4 wherein each switch in the array of switches includes a transistor operating as a switch.

7. The digital-to-analog converter (DAC) of claim 1 wherein the decoding means maintains the logical state of each bit, other than the msb, of word portion $n_1$ of the new digital word.

8. A digital-to-analog converter (DAC) for decoding a multi-bit digital word having a lower word portion of lesser significance and an upper word portion of greater significance, the most significant bit (msb) of the lower word portion and the least significant bit (lsb) of the upper word portion being of equal weight, the DAC comprising:

decoding means for receiving a new digital word and decoding the new digital word by comparing the new digital word to a current digital word and inverting the msb of the lower word portion each time the lsb of the upper word portion changes state; and converter means for converting the decoded new digital word to an analog output value which corresponds to the digital value of the decoded new digital word.

9. The digital-to-analog converter (DAC) of claim 8 wherein the decoding means comprises:

a multi-bit digital word generator which provides the new digital word to be decoded;

a multi-bit storage element coupled between the multi-bit digital word generator and the converter means, wherein the multi-bit storage element stores the current digital word; and a first exclusive-or gate coupled to receive the lsb of the upper word portion of the new digital word from the multi-bit digital word generator and the lsb of the upper word portion of the current digital word from the multi-bit storage element and having a comparison output; and a second exclusive-or gate coupled to receive the comparison output from the first exclusive-OR gate and the msb of the lower word portion of the new digital word from the multi-bit digital word generator, and having a substitute msb output coupled to the multi-bit storage element.

10. The digital-to-analog converter (DAC) of claim 8 wherein the converter means comprises a translation circuit portion receiving a respective one of the word portions and responsively providing a respective intermediate analog output signal indicative of the digital value of the word portion, and wherein the translation circuit portion comprises:

an array of switches, wherein the switches in the array are controlled by respective bits in the word portion and wherein each switch passes a portion of the intermediate analog output signal; and an array of current source transistors coupled in series with the array of switches, each current source transistor providing current to a respective switch.

11. The digital-to-analog converter (DAC) of claim 10 wherein the converter means further comprises at least first and second translation circuit portions, with each translation circuit portion receiving a respective one of the digital word portions.

12. The digital-to-analog converter (DAC) of claim 8 wherein the decoding means maintains the logical state of each bit, other than the msb, of the lower word portion of the new digital word.

13. The digital-to-analog converter (DAC) of claim 8 and further comprising:

a digital word generator which has a step direction input, a step size input and a digital word output, wherein the digital word generator increments or decrements the new digital word, based on the step direction input, by an amount determined by the step size input and applies the new digital word to the digital word output; and wherein the decoding means is coupled between the digital word output and the converter means and has a current digital word input which receives the lsb of the upper word portion of the current digital word.

14. A method for converting a multi-bit digital word into a corresponding analog value, the method comprising:

dividing the multi-bit digital word into a lower digital word portion and an upper digital word portion;

making the binary weight of the most significant bit (msb) of the lower word portion the same as the binary weight of the least significant bit (lsb) of the upper word portion;

detecting whether the lsb of the upper word portion changes state;

decoding the multi-bit digital word by responsively inverting the msb of the lower word portion each time the lsb of the upper word portion changes state;

translating the lower word portion and upper word portion of the decoded multi-bit digital word into respective intermediate analog values; and summing the respective intermediate analog values together to provide an analog output corresponding to the value of the decoded multi-bit digital word.

15. The method of claim 14 wherein the step of decoding the multi-bit digital word comprises maintaining the logical state of each bit, other than the msb, of the lower word portion.

16. A digital-to-analog converter (DAC) for translating a sequence of multi-bit digital words into corresponding analog values, the sequence including a current digital word and a new digital word, wherein the DAC comprises:

circuit means for providing the sequence of digital words, each digital word having a digital value and having multi-bit word portions $n_1$ and $n_2$, in which portion $n_1$ is a least significant portion and portion $n_2$ is a most significant portion, and in which the weight of the most significant bit (msb) of word portion $n_1$ is the same as the weight of the least significant bit (lsb) of word portion $A_2$;

a first exclusive-OR gate having a first input receiving the lb of word portion $n_2$ of the current digital word, a second input receiving the lb of word portion $n_2$ of the new digital word, and an output;

a second exclusive-OR gate having a first input coupled to the output of the first exclusive-OR gate, a second input receiving the msb of word portion $n_1$ of the new digital word, and an output providing a mapped value for the msb of word portion $n_1$ of the new digital word; and circuit means for translating word portions $n_1$ and $n_2$ of the new digital word, with the mapped value of the msb of word portion $n_1$, into respective analog values and for summing the respective analog values together to provide an analog output indicative of the digital value of the digital word.

* * * * *